US011435982B2

(12) United States Patent
Dixit et al.

(10) Patent No.: US 11,435,982 B2
(45) Date of Patent: Sep. 6, 2022

(54) TRUE RANDOM NUMBER GENERATION AND PHYSICALLY UNCLONABLE FUNCTIONS USING VOLTAGE CONTROL OF MAGNETIC ANISOTROPY EFFECTS IN STT-MRAM

(71) Applicant: GLOBALFOUNDRIES U.S. Inc., Santa Clara, CA (US)

(72) Inventors: Hemant M. Dixit, Halfmoon, NY (US); Julien Frougier, Albany, NY (US); Bipul C. Paul, Mechanicville, NY (US); William J. Taylor, Jr., Clifton Park, NY (US)

(73) Assignee: GlobalFoundries U.S. Inc., Santa Clara, CA (US)

( * ) Notice: Subject to any disclaimer, the term of this patent is extended or adjusted under 35 U.S.C. 154(b) by 322 days.

(21) Appl. No.: 16/776,909

(22) Filed: Jan. 30, 2020

(65) Prior Publication Data
US 2021/0240445 A1  Aug. 5, 2021

(51) Int. Cl.
*G06F 7/58* (2006.01)
*G11C 11/16* (2006.01)

(52) U.S. Cl.
CPC ............ *G06F 7/588* (2013.01); *G11C 11/161* (2013.01)

(58) Field of Classification Search
CPC . G06F 7/58; G06F 7/588; G11C 11/16–1693; H04L 9/00; H04L 9/001
USPC ................................................ 708/250, 255
See application file for complete search history.

(56) References Cited

U.S. PATENT DOCUMENTS

| | | | |
|---|---|---|---|
| 8,351,603 B2 | 1/2013 | Oishi et al. | |
| 8,909,942 B1 | 12/2014 | Obukhov et al. | |
| 9,971,566 B2 | 5/2018 | Cambou | |
| 10,078,496 B2 | 9/2018 | Gupta et al. | |
| 2014/0108478 A1 | 4/2014 | Lee et al. | |
| 2019/0347074 A1* | 11/2019 | Choi | G06F 7/588 |
| 2021/0026604 A1* | 1/2021 | Ganguly | H03K 3/84 |

OTHER PUBLICATIONS

Y.Qu et al., A True Random Number Generator base on Parallel STT-MTJs, IEEE 2017 (Year: 2017).*
H. Cai et al., High Performance MRAM with Spin-Transfer-Torque and Voltage-Controlled Magnetic Anisotropy Effects, Applied Sciences, 2017 (Year: 2017).*
Y. Liu et al., A spin orbit torque based true random number generator with real-time optimization, IEEE, 2018 (Year: 2018).*

(Continued)

*Primary Examiner* — Emily E Larocque
(74) *Attorney, Agent, or Firm* — Yee Tze Lim; Hoffman Warnick LLC

(57) ABSTRACT

Embodiments of the disclosure provide a system for providing a true random number (TRN) or physically unclonable function (PUF), including: an array of voltage controlled magnetic anisotropy (VCMA) cells; a voltage pulse tuning circuit for generating and applying a stochastically tuned voltage pulse to the VCMA cells in the array of VCMA cells, wherein the stochastically tuned voltage pulse has a magnitude and duration that provides a 50%-50% switching distribution of the VCMA cells in the array of VCMA cells; and a bit output system for reading a state of each of the VCMA cells in the array of VCMA cells to provide a TRN or PUF.

15 Claims, 11 Drawing Sheets

(56) References Cited

OTHER PUBLICATIONS

Carboni, Roberto et al.; "Random Number Generation by Differential Read of Stochastic Switching in Spin-Transfer Torque Memory"; IEEE Electron Device Letters; vol. 39; No. 7; Jul. 2018; pp. 951-954.

Lee, Hochul et al.; "Design of high-troughput and low-power true random number generator utilizing perpendicularly magnetized voltage-controlled magnetic tunnel junction"; AIP Advances 7; Published online Mar. 6, 2017; pp. 8.

Vatajelu, Elena Ioana et al.; "Security primitives (PUF and TRNG) with STT-MRAM"; IEEE 34th VLSI Test Symposium (VTS); May 26, 2016. pp. 2.

* cited by examiner

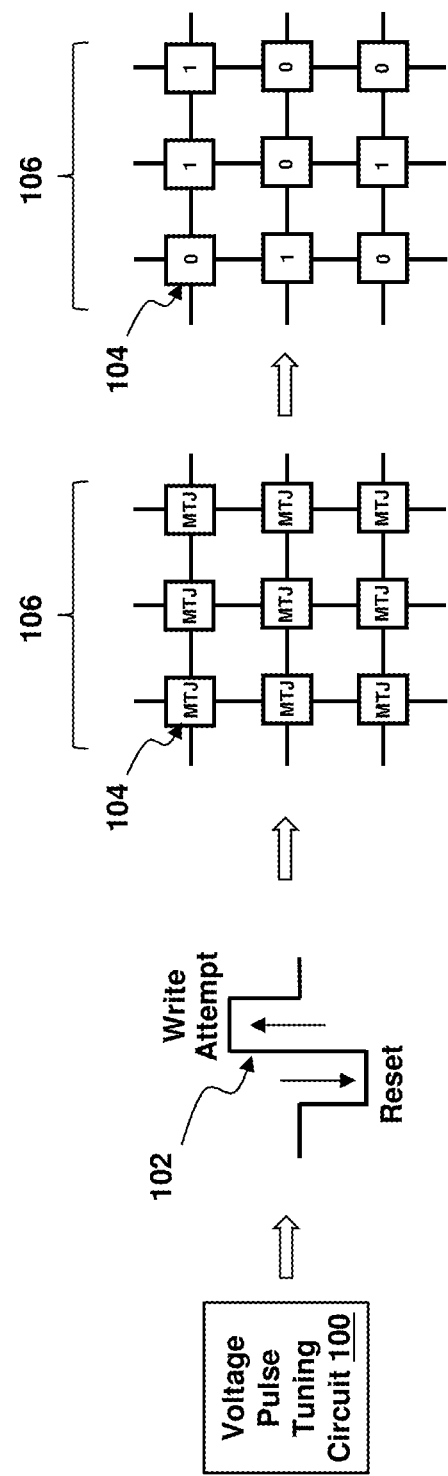

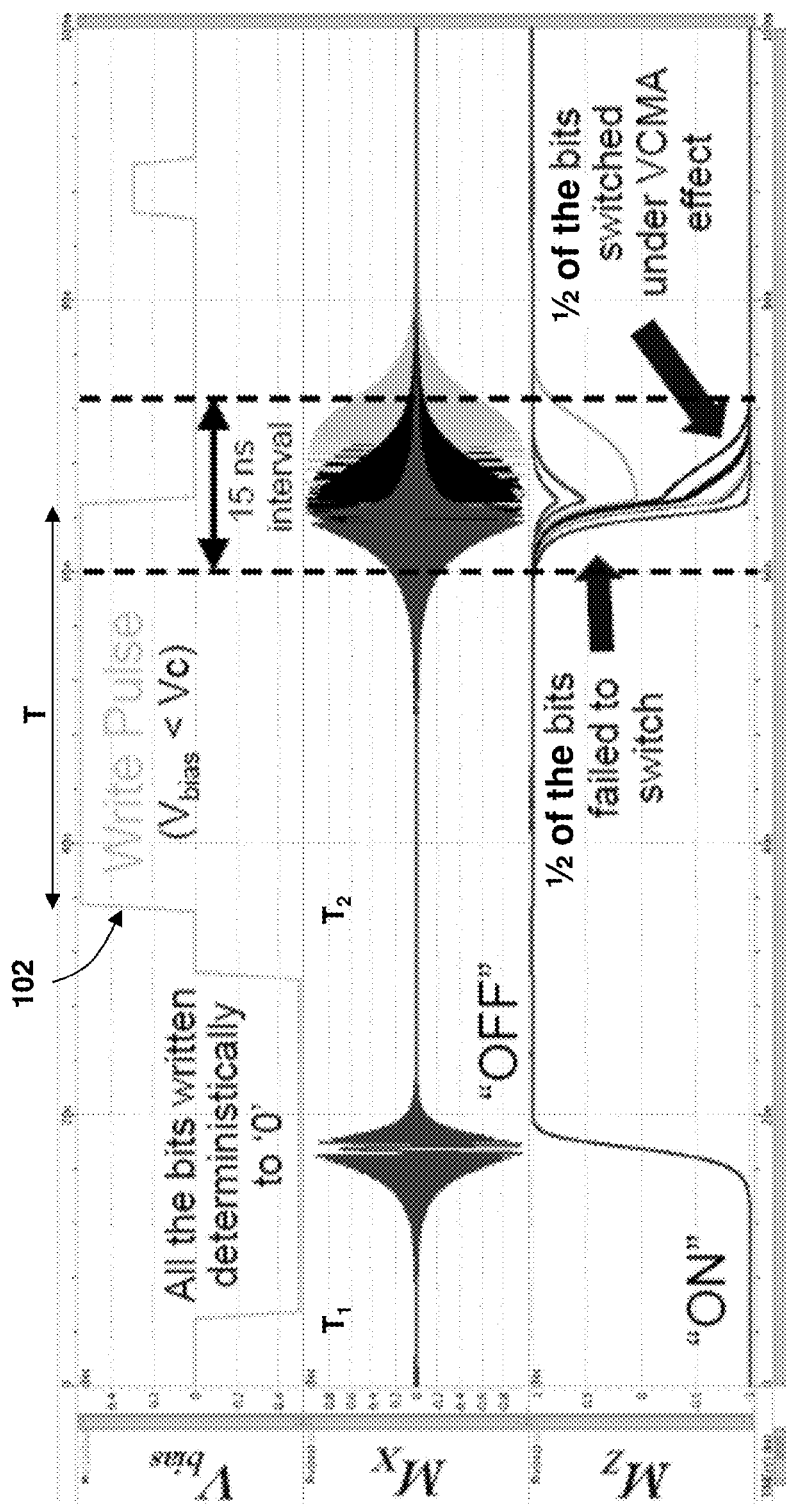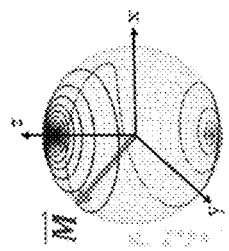
FIG. 10

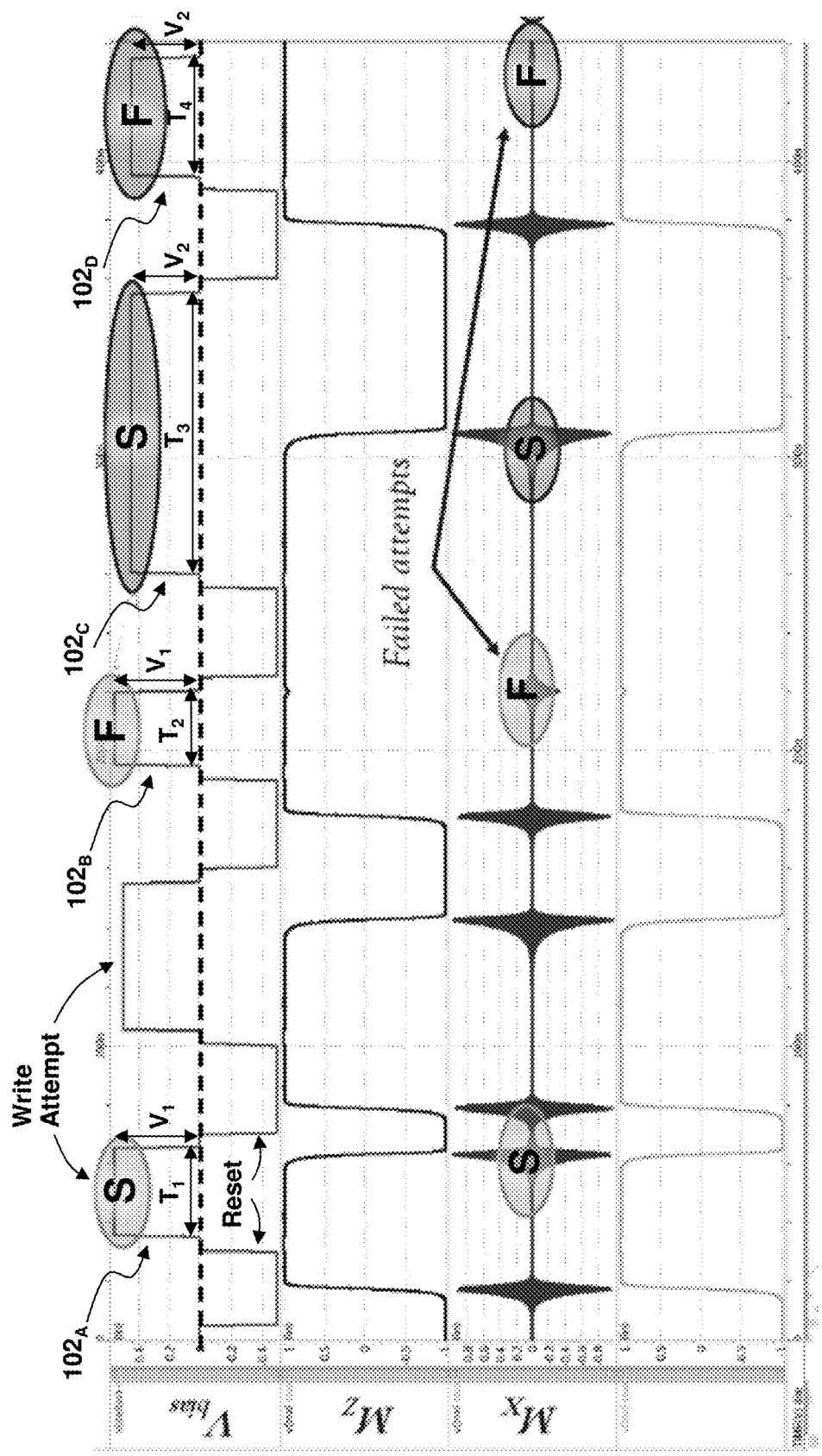
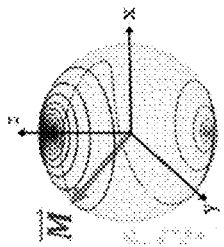
FIG. 12

US 11,435,982 B2

TRUE RANDOM NUMBER GENERATION AND PHYSICALLY UNCLONABLE FUNCTIONS USING VOLTAGE CONTROL OF MAGNETIC ANISOTROPY EFFECTS IN STT-MRAM

BACKGROUND

The present disclosure in general relates to random number generators, and more particularly to the generation of true random numbers and physically unclonable functions using voltage control of magnetic anisotropy effects in spin transfer torque magnetic random access memory (STT-MRAM).

It is widely recognized that the generation of random numbers and physically unclonable functions (e.g., a physically-defined "digital fingerprint" that serves as a unique identifier for a semiconductor device such as a microprocessor) is fundamentally important in today's world. Random number generators may be divided into two basic types: true random number generators (TRNGs), which generate numbers using a non-deterministic or stochastic source, and pseudorandom number generators, which generate numbers using a deterministic algorithm.

A TRNG may use a non-deterministic or stochastic source to produce random numbers and/or physically unclonable functions. Many TRNGs operate by measuring unpredictable natural processes, such as thermal noise, atmospheric noise, or nuclear decay. Some devices produce nearly truly random numbers, but they are subject to being skewed by external influences (e.g., temperature, process, and/or temperature variations).

SUMMARY

A first aspect of the disclosure is directed to a system, including: an array of voltage controlled magnetic anisotropy (VCMA) cells; a voltage pulse tuning circuit for generating and applying a stochastically tuned voltage pulse to the VCMA cells in the array of VCMA cells, wherein the stochastically tuned voltage pulse has a magnitude and duration that provides a 50%-50% switching distribution of the VCMA cells in the array of VCMA cells; and a bit output system for reading a state of each of the VCMA cells in the array of VCMA cells to provide a true random number (TRN) or physically unclonable function (PUF).

A second aspect of the disclosure is directed to a method for generating a true random number (TRN) or physically unclonable function (PUF), including generating a stochastically tuned voltage pulse; applying the stochastically tuned voltage pulse to a plurality of voltage controlled magnetic anisotropy (VCMA) cells in an array of VCMA cells, wherein the stochastically tuned voltage pulse has a magnitude and duration that provides a 50%-50% switching distribution of the VCMA cells in the array of VCMA cells; and reading a state of each of the VCMA cells in the array of VCMA cells to provide the true random number (TRN) or physically unclonable function (PUF).

A third aspect of the disclosure provides a system for generating a true random number (TRN) or physically unclonable function (PUF), including: a spin transfer torque magnetic random access memory (STT-MRAM), the STT-MRAM including an array of voltage controlled magnetic anisotropy (VCMA) cells; a voltage pulse tuning circuit for generating and applying a stochastically tuned voltage pulse to the VCMA cells in the array of VCMA cells, wherein the stochastically tuned voltage pulse has a magnitude and duration that provides a 50%-50% switching distribution of the VCMA cells in the array of VCMA cells; and a bit output system for reading a state of each of the VCMA cells in the array of VCMA cells to provide the true random number (TRN) or physically unclonable function (PUF).

The foregoing and other features of the disclosure will be apparent from the following more particular description of embodiments of the disclosure.

BRIEF DESCRIPTION OF THE DRAWINGS

The embodiments of this disclosure will be described in detail, with reference to the following figures, wherein like designations denote like elements.

FIG. 5 depicts a voltage pulse tuning circuit capable of varying a duration and/or magnitude of a stochastically tuned voltage pulse to obtain a 50%-50% switching distribution of the VCMA cells in an array of VCMA cells according to embodiments.

FIG. 10 is a simulation result depicting the random switching of a plurality of VCMA cells in a VCMA array under the VCMA effect using a tunable voltage source according to embodiments.

FIG. 12 is a simulation result depicting how the variation of the magnitude and/or duration of a tunable voltage pulse can affect the successful switching of a VCMA cell having a first set of material characteristics according to embodiments.

Figure 2:
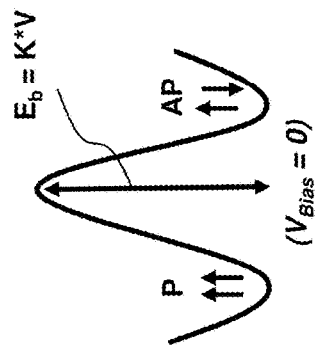
FIG. 2 depicts the energy barrier $E_B$ between the parallel state P and the anti-parallel state AP of the MTJ device of FIG. 1 for a zero voltage bias $V_{Bias}$ ($V_{Bias}=0$).

It is noted that the drawings of the disclosure are not necessarily to scale. The drawings are intended to depict only typical aspects of the disclosure, and therefore should not be considered as limiting the scope of the disclosure. In the drawings, like numbering represents like elements between the drawings.

DETAILED DESCRIPTION

In the following description, reference is made to the accompanying drawings that form a part thereof, and in which is shown by way of illustration specific exemplary embodiments in which the present teachings may be practiced. These embodiments are described in sufficient detail to enable those skilled in the art to practice the present teachings, and it is to be understood that other embodiments may be used and that changes may be made without departing from the scope of the present teachings. The following description is, therefore, merely illustrative.

According to embodiments of the present disclosure, a true random number (TRN) and/or physically unclonable function (PUF) may be generated by applying a tunable voltage pulse to an array of voltage controlled magnetic anisotropy (VCMA) cells (e.g., an array of magnetic tunnel junction (MTJ) devices) in a spin transfer torque magnetic random access memory (STT-MRAM). Advantageously, the tunable voltage pulse, together with thermal noise from ambient operating conditions, induces probabilistic switching at the array level, such that the switching probability of the array of VCMA cells is truly random and is not affected by process, voltage, and temperature (PVT) variations within the VCMA cells.

Figure 1:
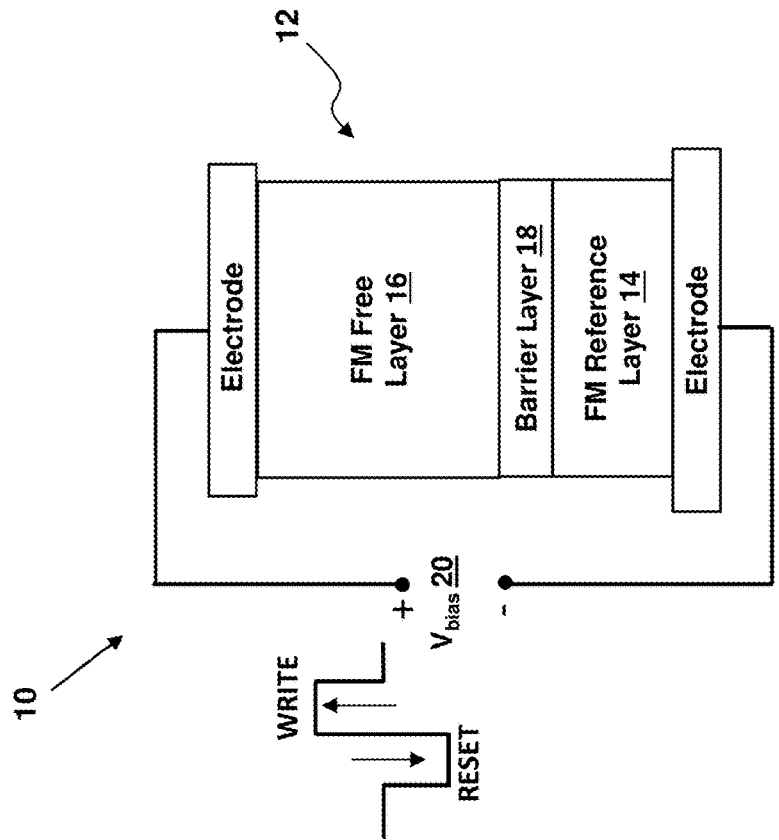
FIG. 1 depicts a magnetic tunnel junction (MTJ) device according to embodiments.

According to embodiments, each VCMA cell in the array of VCMA cells forming the STT-MRAM may comprise a magnetic tunnel junction (MTJ) device. An example of a VCMA cell 10 formed using an MTJ device 12 is depicted in FIG. 1. As shown, the MTJ device 12 includes a ferromagnetic (FM) fixed (i.e., reference) layer 14 formed of a ferromagnetic material, an FM free layer 16 formed of a ferromagnetic material, and an insulating barrier layer 18 separating the FM fixed layer 14 from the FM free layer 16. The material, shape, and thickness of the FM fixed layer 14 and the FM free layer 16 are selected to have out-of-plane (OOP) anisotropy. The anisotropy energy of the FM free layer 16 is affected by interface properties between the FM fixed layer 14, the FM free layer 16, and the barrier layer 18, and the magnitude of the anisotropy energy is controlled by a bias voltage $V_{Bias}$ 20, giving rise to a VCMA effect that switches the magnetization orientation of the FM free layer 16 in the MTJ device 12. The thickness of the barrier layer 18 is selected to allow sufficient leakage current for determining a direction of switching based on a leakage-current induced magnetic torque in response to the applied voltage bias voltage 20.

Examples of suitable ferromagnetic materials for forming the FM fixed layer 14 and the FM free layer 16 may include a ferromagnetic material or ferromagnetic material alloy including one or more elements such as cobalt (Co), iron (Fe), nickel (Ni), boron (B), iridium (Ir), aluminum (Al) or other suitable materials/alloys. Examples of suitable materials for forming the barrier layer 18 may include, for example, dielectric oxides such as magnesium oxide (MgO), hafnium dioxide ($H_fO_2$), aluminum oxide ($Al_2O_3$), gadolinium oxide ($Gd_2O_3$), chromium oxide ($Cr_2O_3$). or other suitable materials/alloys.

Figure 3:
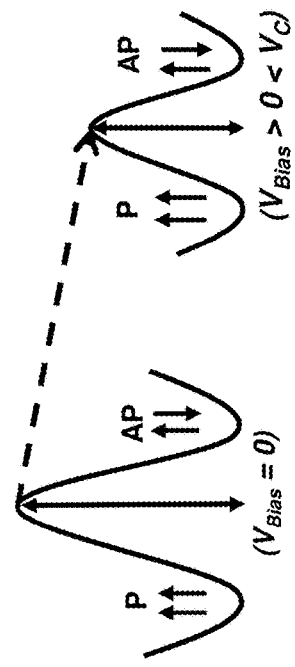
FIG. 3 depicts the reduction of the energy barrier $E_B$ between the parallel state P and the anti-parallel state AP of the MTJ device of FIG. 1 for a non-zero voltage bias $V_{Bias}$ less than a critical voltage $V_C$ ($V_{Bias}>0<V_C$).
Figure 4:
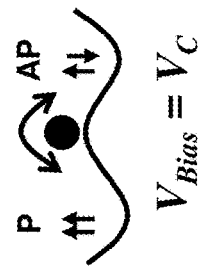
FIG. 4 depicts the elimination of the energy barrier $E_B$ between the parallel state P and the anti-parallel state AP of the MTJ device of FIG. 1 for a bias voltage $V_{Bias}$ equal to the critical voltage $V_C$ ($V_{Bias}=V_C$).

The "ON" and "OFF" states of the VCMA cell 10 are distinguished by the parallel (P) and anti-parallel (AP) state of the FM free layer 16 with respect to the FM reference layer 14. As depicted in FIG. 2, in order to switch from a parallel state P (↑↑) to an anti-parallel state AP (↑↓) (with $V_{Bias}$=0), energy given by $E_B$=K*V must be supplied, where $E_B$ is the energy barrier between the parallel state P and the anti-parallel state AP, K is the perpendicular magnetic anisotropy energy, and V is the volume of the FM free layer 16. As illustrated in FIG. 3, under the VMCA effect, an applied bias voltage $V_{Bias}$ reduces the energy barrier $E_B$, decreasing the energy required to switch from a parallel state P to an anti-parallel state AP or from an anti-parallel state AP to a parallel state P. As shown in FIG. 4, the energy barrier $E_B$ is eliminated when the applied bias voltage $V_{Bias}$ is equal to a critical voltage $V_C$.

Various efforts for exploiting VCMA and STT driven switching for random number generation have been attempted. Unfortunately, such attempts have been found to be sensitive to process, voltage, and temperature variations. To this extent, the switching distribution (i.e., 0→1, 1→0) may vary significantly from the 50%-50% ratio required for true random number generation.

According to embodiments, a system and method for providing true random number generation and physically unclonable functions that is not sensitive to process, voltage, and temperature (PVT) variations is provided. As depicted in FIG. 5, a stochastic voltage source, which may include, for example, a voltage pulse tuning circuit 100 capable of varying a duration and/or height (magnitude) of a stochastic tuned bias voltage ($V_{Bias}$) pulse 102 (hereafter tuned voltage pulse 102), is used to obtain a 50%-50% switching distribution of the VCMA cells 104 (e.g., MTJ devices) in an array 106 (hereafter VCMA array 106) of VCMA cells 104 (e.g., in an MRAM). The VMCA effect is used to lower the energy barrier $E_B$ between the parallel state P and anti-parallel state AP of the VCMA cells 104 in the VCMA array 106. When the energy barrier $E_B$ is reduced significantly (e.g., less than or equal to thermal ambiance) by the tuned voltage pulse 102, the switching of the VCMA cells 104 in the VCMA array 106 becomes probabilistic. Thus, if an arbitrary and suitably shaped (e.g., magnitude and duration) tuned voltage pulse 102 is applied to the VCMA cells 104 in the VCMA array 106 and switching of the VCMA cells 104 is attempted, a random sequence of information will be stored in the VCMA cells 104 in the VCMA array 106 each time switching is attempted.

Figure 7:
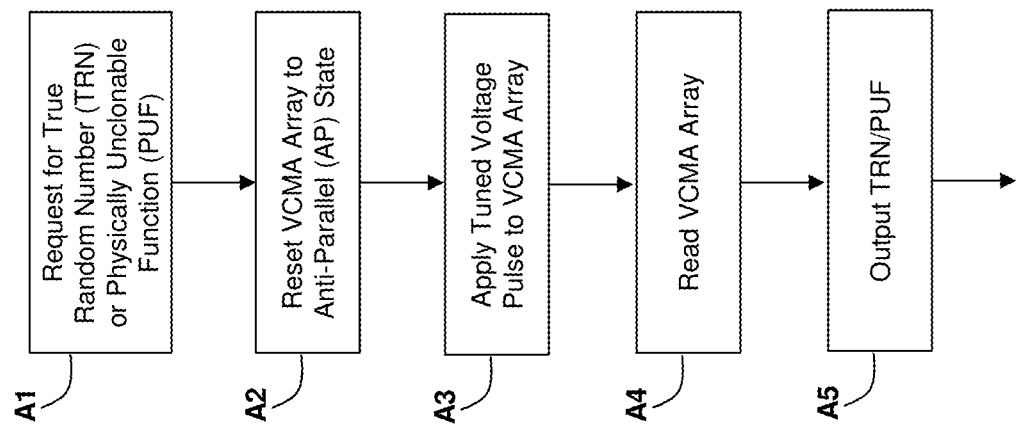
FIG. 7 depicts a flow diagram of a process for generating a TRN/PUF according to embodiments.
Figure 6:
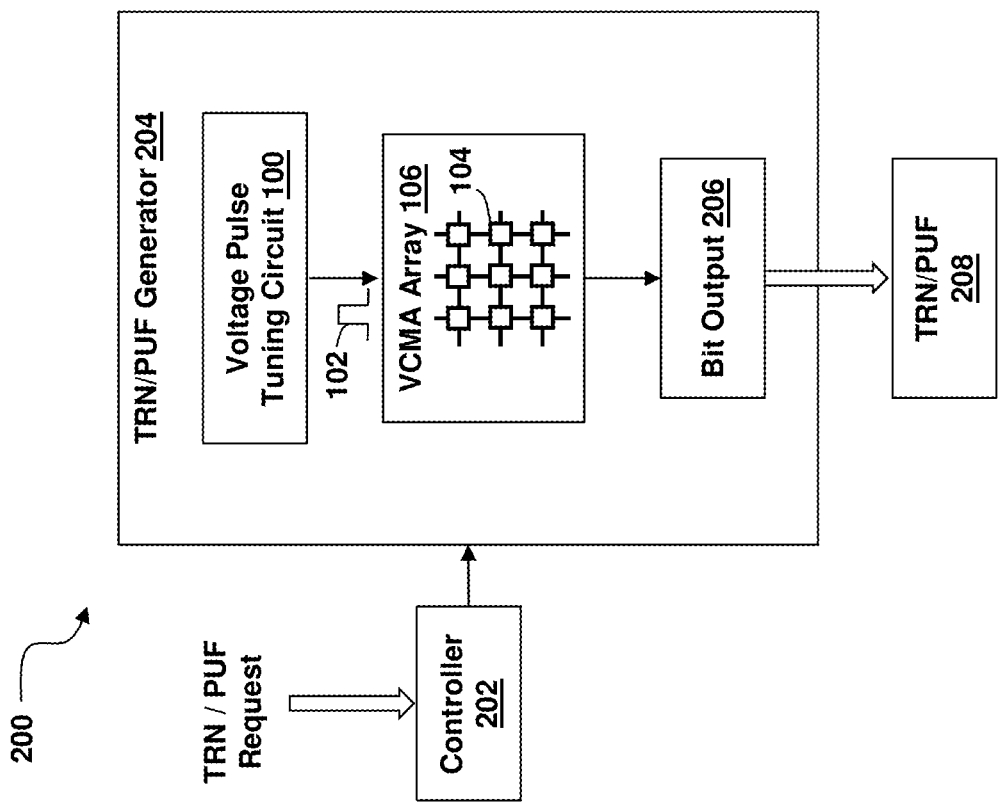
FIG. 6 depicts a system for generating a true random number (TRN) or physically unclonable function (PUF) according to embodiments.

A system 200 for generating a true random number (TRN) or physically unclonable function (PUF) (e.g., for an encryption key and/or the like) according to embodiments is depicted in FIG. 6. A corresponding flow diagram of a process for generating a TRN/PUF is depicted in FIG. 7. FIGS. 6 and 7 are referred to concurrently.

The system 200 depicted in FIG. 6 may include a controller 202 and a TRN/PUF generator 204. The TRN/PUF generator 204 may include a voltage pulse tuning circuit 100, a VCMA array 106 including a plurality of VCMA cells 104, and a bit output system 206 for reading the VCMA cells 104 of the VCMA array 106. In the flow diagram depicted in FIG. 7, at process A1, a request (e.g., from a host or other requesting entity) for a TRN/PUF 208 is received at the controller 202. At process A2, the controller 202 instructs the voltage pulse tuning circuit 100 to apply a reset voltage pulse to the VCMA cells 104 in the VCMA array 106 to reset the VCMA cells 104 to an anti-parallel state AP. At process A3, the voltage pulse tuning circuit 100 performs a stochastic write operation by applying a tuned voltage pulse 102 to the VCMA cells 104 in the VCMA array 106. According to embodiments, in response to the tuned voltage pulse 102, 50% of the VCMA cells 104 in the VCMA array 106 are successfully switched from the anti-parallel state AP (e.g., as set by the reset pulse) to a parallel state P, while 50% of the VCMA cells 104 in the VCMA array 106 fail to switch and remain in the anti-parallel state AP. The magnitude and duration of the tuned voltage pulse 102 are selected such that each VCMA cell 104 in the VCMA array 106 has a truly random switching probability. A range (typically narrow) of magnitudes ($V_{min}$–$V_{max}$) and durations ($T_{min}$–$T_{max}$) for the tuned voltage pulse 102 (e.g., based on the material (e.g., magnetic) properties of the VCMA cells 104 in the VCMA array 106) may be capable of providing a 50%-50% switching distribution of the VCMA cells 104 in the VCMA array 106.

At process A4, the bit output system 206 reads the state (e.g., resistance state) of each VCMA cell 104 in the VCMA array 106 and outputs a corresponding TRN/PUF 208. The bit output system 206 may include, for example, a sense amplifier-based circuit or circuit capable of reading the states of the VCMA cells 104 in the VCMA array 106. At process A5, the TRN/PUF is provided to the requesting entity. The TRN/PUF 208 may, for example, include a "1" for each VCMA cell 104 in the VCMA array 106 that has switched to a parallel state P and a "0" for each VCMA cell 104 in the VCMA array 106 that has failed to switch and has remained in an anti-parallel state AP.

Figure 9:
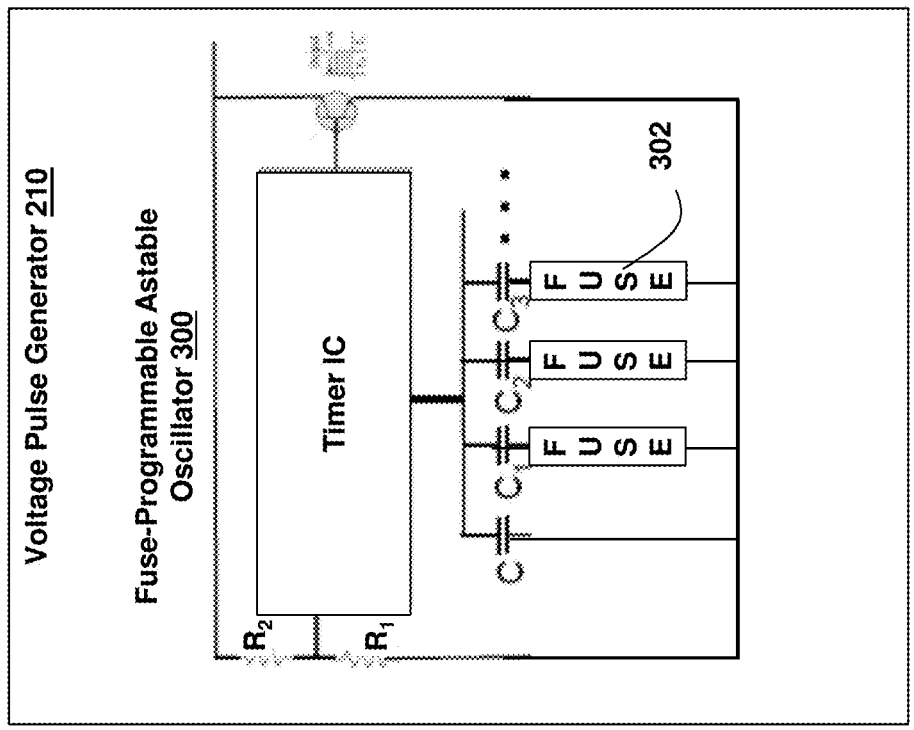
FIG. 9 depicts a voltage pulse generator including a fuse-programmable astable oscillator for generating a stochastically tuned voltage pulse according to embodiments.
Figure 8:
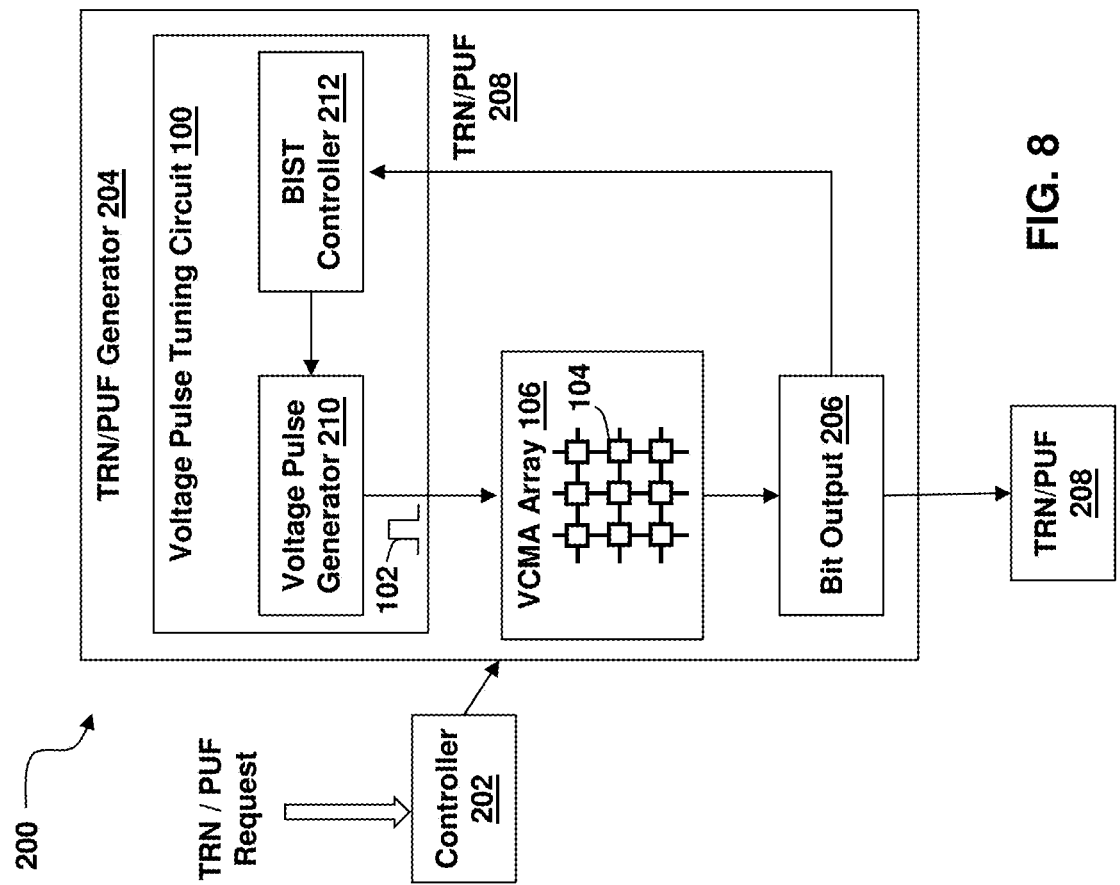
FIG. 8 depicts the system of FIG. 6 in greater detail.

According to embodiments, as depicted in FIG. 8, the voltage pulse tuning circuit 100 may include any type of voltage pulse generator 210 capable of generating a tuned voltage pulse 102 including, without limitation, an astable oscillator circuit, a pulse wave modulation (PWM) circuit, a pseudo-random binary sequence circuit, and/or the like. An example of a fuse-programmable astable oscillator circuit 300 capable of generating a tuned voltage pulse 102 is depicted in FIG. 9. In the oscillator circuit 300, the magnitude and duration of the output voltage pulse is dependent upon the values of R1, R2, and the total capacitance $C_T$ given by $C+C_1+C_2+C_3+\ldots$, where each of the capacitors $C_1, C_2, C_3, \ldots$ is coupled to ground through a respective fuse 302. The total capacitance $C_T$ (and thus the duration of the output voltage pulse) can be adjusted (e.g., reduced), for example, by selectively burning (blowing) one or more of the fuses 302 by applying a high-voltage pulse across the fuse 302.

According to embodiments, the voltage pulse tuning circuit 100 may further include a built-in self test (BIST) system 212 coupled to the voltage pulse generator 210. As depicted in FIG. 8, for example, the TRN/PUF 208 provided by the bit output system 206 may be fed back to the BIST system 212. In response, the BIST system 212 may be configured to adjust (or instruct the voltage pulse generator 210 to adjust), if necessary, the magnitude and/or duration tuned voltage pulse 102 output by the voltage pulse generator 210 (e.g., in order to provide/maintain a 50%-50% switching ratio). For example, with reference again to FIG. 9, the BIST system 212 may be configured to selectively burn (blow) one or more of the fuses 302 of the fuse-programmable astable oscillator 300 in order to change (e.g., reduce) the duration of the tuned voltage pulse 102 output by the voltage pulse generator 210.

FIG. 10 is a simulation result depicting the random switching of a VCMA array 106 including a plurality of VCMA cells 104 (e.g., MTJs) under the VCMA effect according to embodiments. In the simulation, a typical set of material parameters representative of current STT-MRAM technology has been used. In particular, FIG. 10 depicts a bias voltage $V_{Bias}$ ($V_{Bias}<V_C$) applied to the of VCMA cells 104 in the VCMA array 106 and the resultant magnetic moments $M_X$ and $M_Z$ of the VCMA cells 104 in the x and z directions, respectively.

At a time $T_1$, a reset voltage pulse is applied to the VCMA cells 104 in the VCMA array 106 to deterministically reset the VCMA cells 104 to an anti-parallel state AP (e.g., to "0"). At a time $T_2$, a tuned voltage pulse 102, having a magnitude $V_{Bias}<V_C$ and duration T is applied to the VCMA cells 104 in the VCMA array 106. In response, ½ of the VCMA cells 104 in the VCMA array 106 switched to a parallel state P (e.g., to "1), while the other half of the VCMA cells 104 in the VCMA array 106 failed to switch and remained in an anti-parallel state AP.

Figure 11:
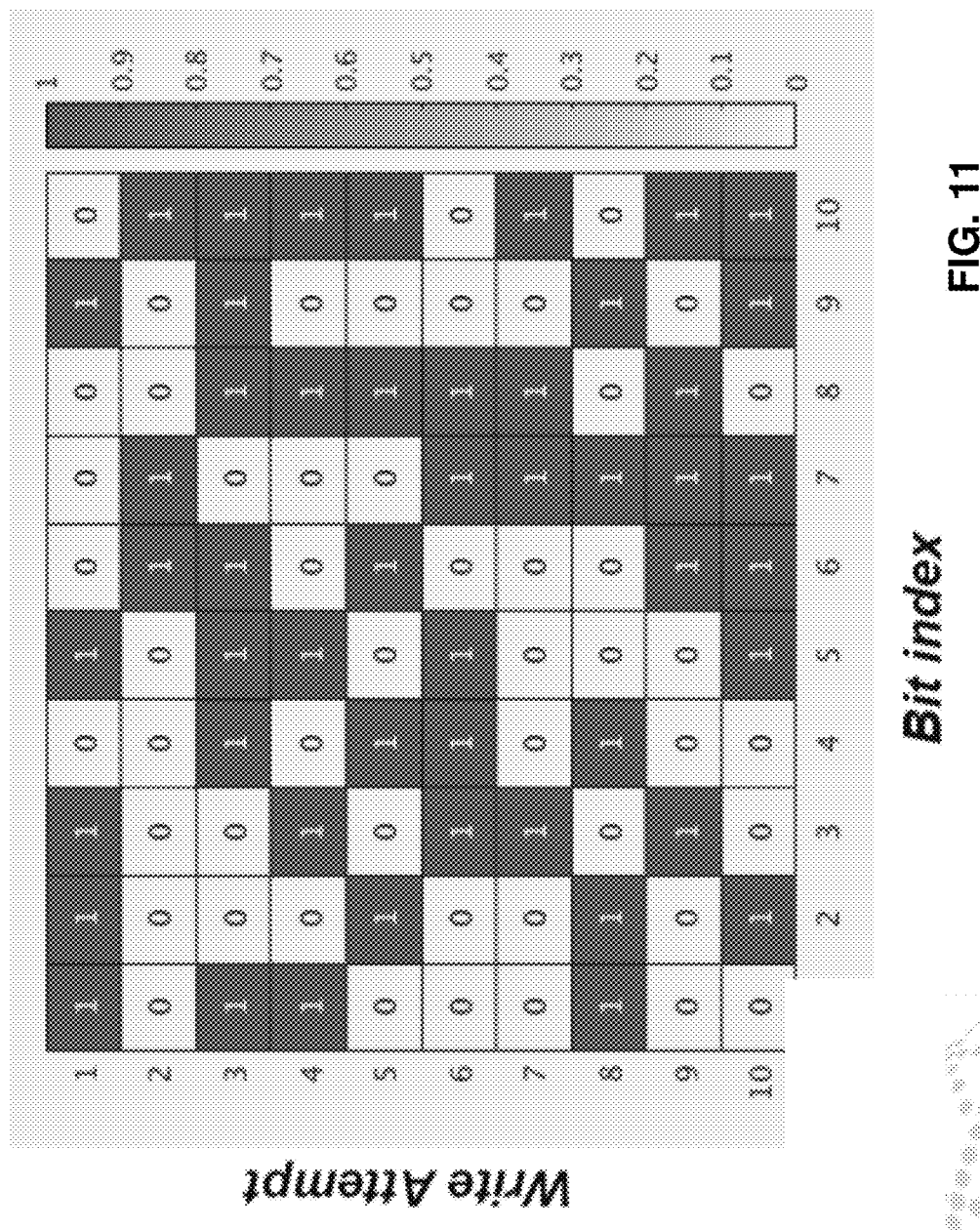
FIG. 11 is a simulation result of a bit array map for a VCMA array including ten VCMA cells after ten switching attempts using a tunable voltage pulse according to embodiments.

FIG. 11 is a simulation result depicting a bit array map for a VCMA array 106 including ten VCMA cells 104 after ten switching attempts (e.g., using the tuned voltage pulse 102 depicted in FIG. 10) according to embodiments. As shown in FIG. 11, an equiprobable switching distribution was obtained (switched—50%, failed to switch—50%) in response to the tuned voltage pulse 102. Advantageously, as detailed below, the 50/50 switching distribution is not affected by process, voltage, and temperature variations.

FIG. 12 is a simulation result depicting how the variation of the magnitude and/or duration of the tuned voltage pulse 102 may affect the successful switching of a VCMA cell 104 having a first set of material characteristics according to embodiments. In FIG. 12, a series of reset pulses and different stochastically tuned voltage pulses 102 were applied to a VCMA cell 104 having a first set of material parameters. As shown in FIG. 12, the VCMA cell 104 successfully switched in response to the application of a tuned voltage pulse $102_A$ with a magnitude $V_1$ and duration $T_1$. However, the VCMA cell 104 did not switch in response to the application of a tuned voltage pulse $102_B$ with the same magnitude $V_1$ as the tuned voltage pulse $102_A$, but shorter duration $T_2$ ($T_2<T_1$). The VCMA cell 104 again successfully switched in response to the application of a tuned voltage pulse $102_C$ with a magnitude $V_2$ smaller than that of the tuned voltage pulses $102_A$, $102_B$ ($V_2<V_1$) and a duration $T_3$ longer than that of the tuned voltage pulses $102_A$, $102_B$ ($T_3>T_1>T_2$). However, the VCMA cell 104 did not switch in response to the application of a tuned voltage pulse $102_D$ with the same magnitude $V_2$ as the tuned voltage pulse $102_C$, but shorter duration $T_4$ ($T_3<T_4$), even through the duration $T_4$ is greater than that of the tuned voltage pulses $102_A$, $102_B$ ($T_3>T_4>T_1>T_2$).

Figure 13:
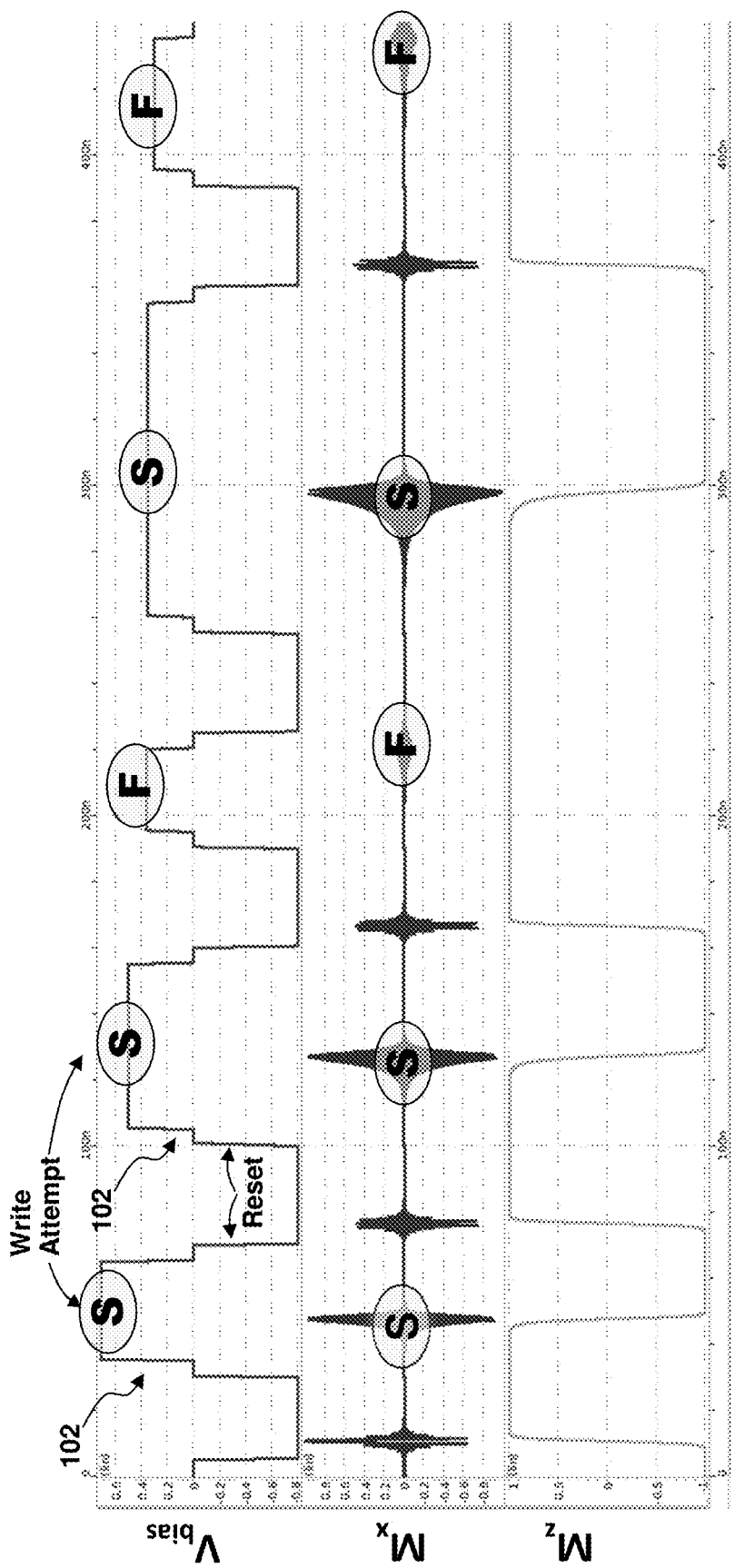
FIG. 13 is a simulation result depicting how the variation of the magnitude and/or duration of a tunable voltage pulse can affect the successful switching of a VCMA cell having a second, different set of material characteristics according to embodiments.

FIG. 13 is a simulation result depicting how the variation of the magnitude and/or duration of the tuned voltage pulse 102 may affect the successful switching of a VCMA cell 104 having a second, different set of material characteristics according to embodiments. Comparing FIGS. 12 and 13, it can be seen that the material characteristics of a VCMA cell 104 may affect the switching of the VCMA cell.

Figure 14:
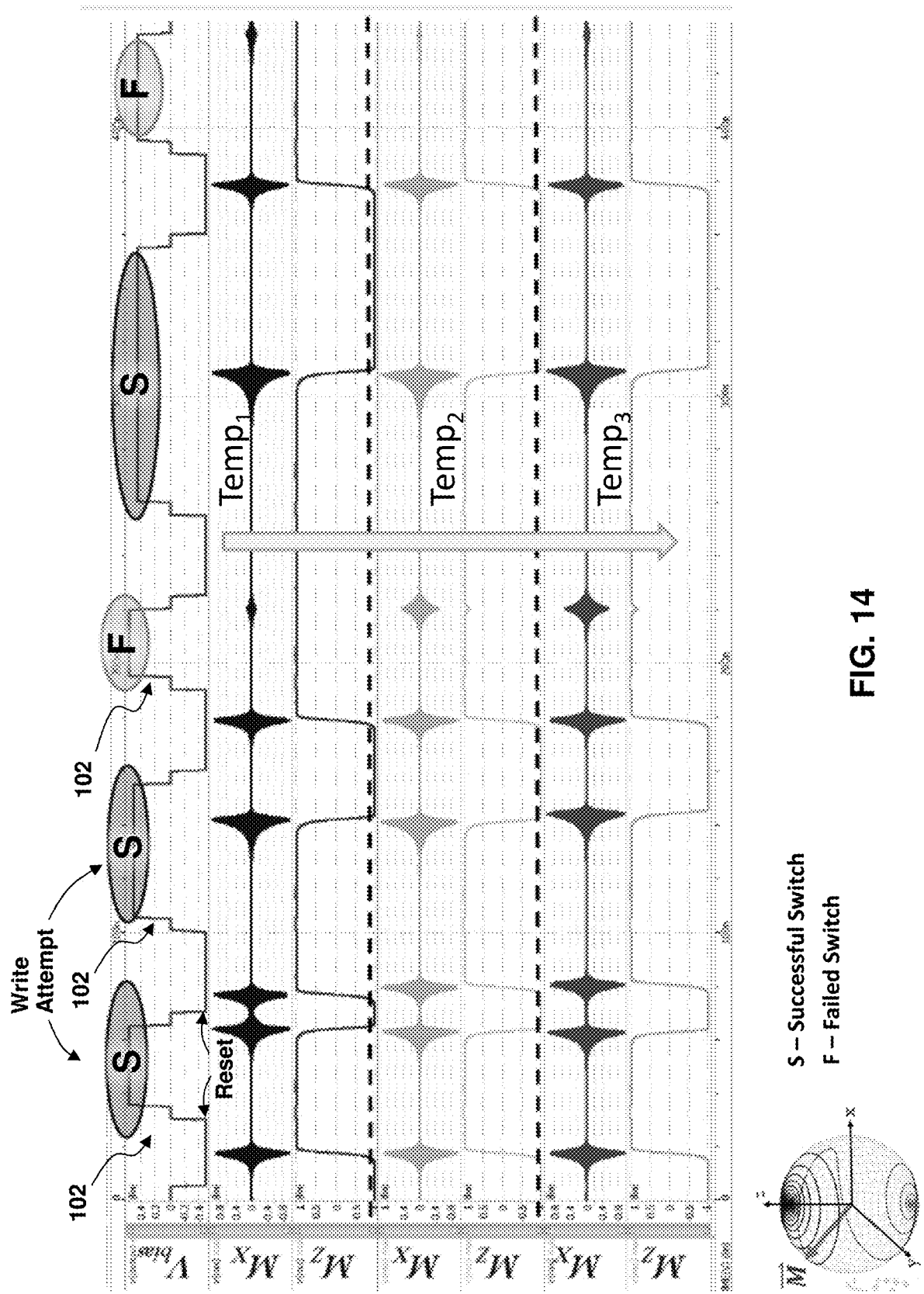
FIG. 14 is a simulation result depicting the temperature independence of the switching of a VCMA cell in response to a tunable voltage pulse according to embodiments.

FIG. 14 is a simulation result depicting the temperature independence of the switching of a VCMA cell 104 according to embodiments. In FIG. 13, a sequence of reset voltage pulses and different stochastically tuned voltage pulses 102 were applied to a VCMA cell 104 at three different temperatures $Temp_1$, $Temp_2$, and $Temp_3$ (e.g., –40° C., 25° C., and 125° C.). Advantageously, according to embodiments, the same pattern of switching success/failure (S/F) of the VCMA cell 104 was observed irrespective of temperature (e.g., irrespective of the amount of thermal noise in the VCMA cell 104 at each different temperature). To this extent, the stochastic nature of the tuned voltage pulses 102 is sufficient to address any variations in the energy barrier $E_B$ (e.g., due to thermal noise).

Figure 15:
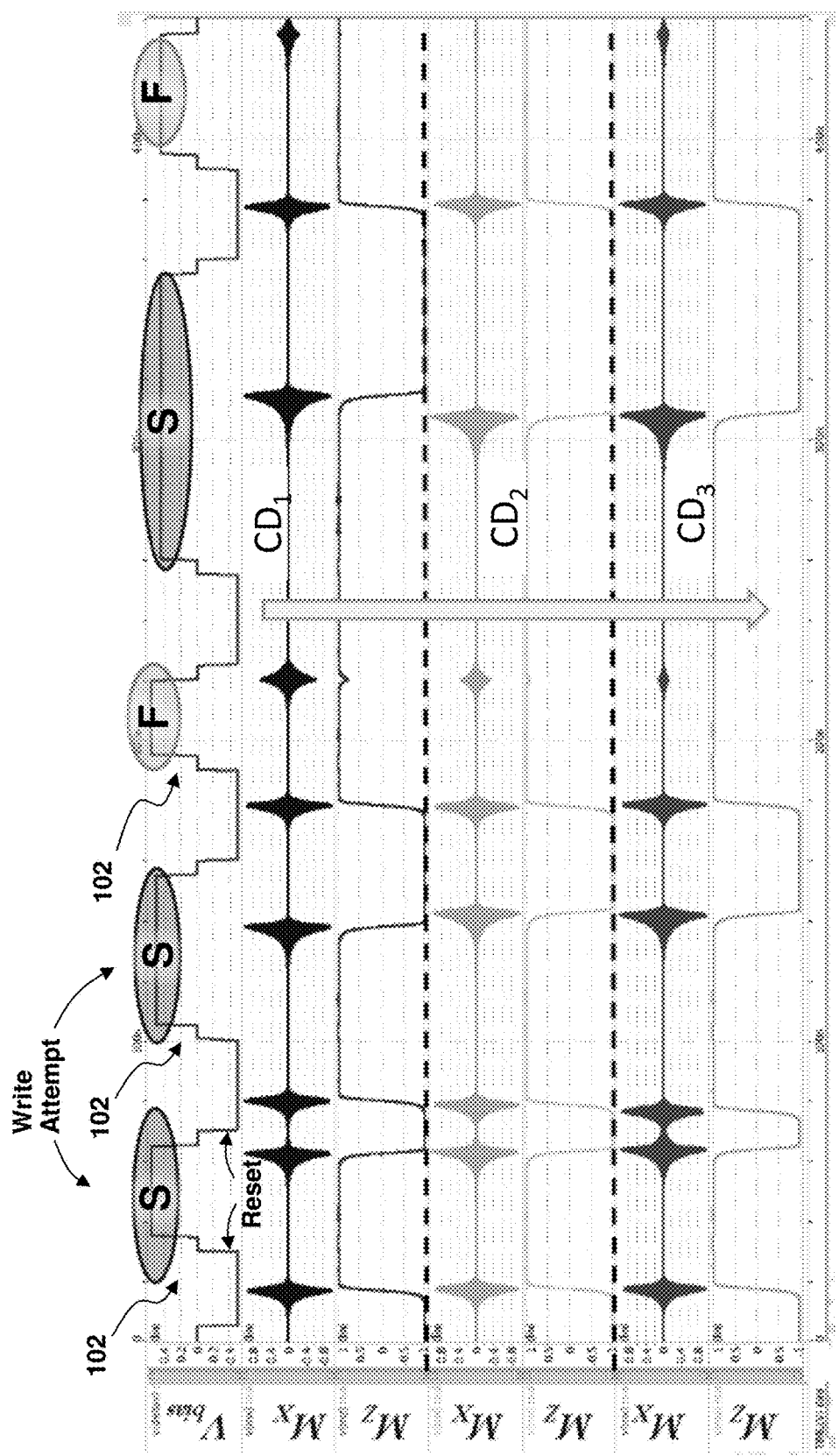
FIG. 15 is a simulation result depicting the process independence of the switching of a VCMA cell in response to a tunable voltage pulse according to embodiments.

FIG. 15 is a simulation result depicting the process independence of the switching of a VCMA cell 104 according to embodiments. In FIG. 14, a sequence of reset voltage pulses and different stochastically tuned voltage pulses 102 were applied to a VCMA cell 104 for three different critical dimensions $CD_1$, $CD_2$, and $CD_3$ (e.g., 45 nm, 50 nm, and 55 nm). It should be understood by the reader that one of the many processing variables that may exist when manufacturing a semiconductor device (e.g., VCMA cell 104) is the 'critical dimension', which represents the dimension of the smallest geometrical feature (width of interconnect line, contacts, trenches, etc.) that can be formed during semiconductor device manufacturing using a given technology. Advantageously, according to embodiments, the same pattern of switching success/failure (S/F) of the VCMA cell 104 was observed irrespective of CD. To this extent, the stochastic nature of the tuned voltage pulse 102 is sufficient to address any variations in the energy barrier $E_B$ due to process variations (e.g., variations in CD).

Figure 16:
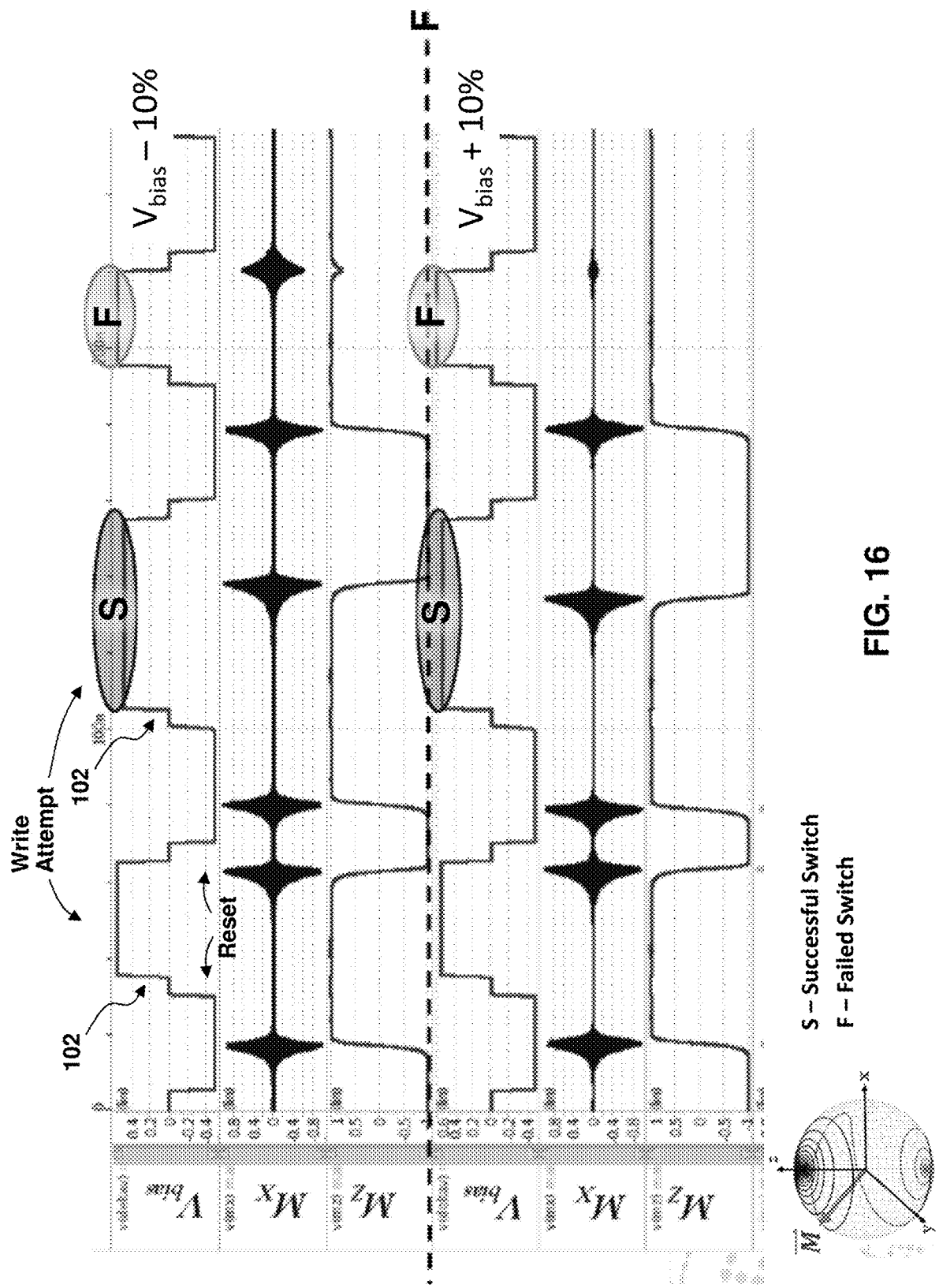
FIG. 16 is a simulation result depicting the voltage independence of the switching of a VCMA cell in response to a tunable voltage pulse according to embodiments.

FIG. 16 is a simulation result depicting the independence of the switching of a VCMA cell 104 from voltage variations according to embodiments. In FIG. 15, a sequence of reset voltage pulses and different stochastically tuned voltage pulses 102 were applied to a VCMA cell 104, for a ±10% standard deviation in the bias voltage $V_{Bias}$. Advantageously, according to embodiments, the same pattern of switching success/failure (S/F) of the VCMA cell 104 was observed irrespective of variations in the voltage bias $V_{Bias}$. To this extent, the stochastic nature of the tuned voltage pulses 102 is sufficient to address any variations in the energy barrier $E_B$ due to variations in the bias voltage $V_{Bias}$.

The terminology used herein is for the purpose of describing particular embodiments only and is not intended to be limiting of the disclosure. As used herein, the singular forms "a", "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof. "Optional" or "optionally" means that the subsequently described event or circumstance may or may not occur, and that the description includes instances where the event occurs and instances where it does not.

Approximating language, as used herein throughout the specification and claims, may be applied to modify any quantitative representation that could permissibly vary without resulting in a change in the basic function to which it is related. Accordingly, a value modified by a term or terms, such as "about," "approximately," and "substantially," are not to be limited to the precise value specified. In at least some instances, the approximating language may correspond to the precision of an instrument for measuring the value. Here and throughout the specification and claims, range limitations may be combined and/or interchanged, such ranges are identified and include all the sub-ranges contained therein unless context or language indicates otherwise. "Approximately" as applied to a particular value of a range applies to both values, and unless otherwise dependent on the precision of the instrument measuring the value, may indicate +/−10% of the stated value(s).

The corresponding structures, materials, acts, and equivalents of all means or step plus function elements in the claims below are intended to include any structure, material, or act for performing the function in combination with other claimed elements as specifically claimed. The description of the present disclosure has been presented for purposes of illustration and description, but is not intended to be exhaustive or limited to the disclosure in the form disclosed. Many modifications and variations will be apparent to those of ordinary skill in the art without departing from the scope and spirit of the disclosure. The embodiment was chosen and described in order to best explain the principles of the disclosure and the practical application, and to enable others of ordinary skill in the art to understand the disclosure for various embodiments with various modifications as are suited to the particular use contemplated.

The invention claimed is:

1. A system, comprising:
an array of voltage controlled magnetic anisotropy (VCMA) cells;
a voltage pulse tuning circuit including a voltage pulse generator for generating and applying a stochastically tuned voltage pulse to the VCMA cells in the array of VCMA cells, wherein the stochastically tuned voltage pulse has a magnitude and duration that provides a 50%-50% switching distribution of the VCMA cells in the array of VCMA cells; and
a bit output system for reading a state of each of the VCMA cells in the array of VCMA cells to provide a true random number (TRN) or physically unclonable function (PUF),
wherein the voltage pulse generator includes a fuse-programmable circuit configured to generate the tuned voltage pulse, the fuse-programmable circuit including a plurality of capacitors and a plurality of fuses, wherein each capacitor is coupled to ground through a respective fuse, and wherein the duration of the tuned voltage pulse is adjusted by selectively blowing at least one of the fuses.

2. The system according to claim 1, wherein each VCMA cell in the array of VCMA cells comprises a magnetic tunnel junction (MTJ) device.

3. The system according to claim 1, wherein the array of VCMA cells comprise a spin transfer torque magnetic random access memory (STT-MRAM).

4. The system according to claim 1, further comprising a built-in test (BIST) system coupled to the voltage pulse generator, wherein the bit output system provides the TRN or PUF to the BIST, wherein the BIST system is configured to adjust the duration of the tuned voltage pulse by selectively blowing at least one of the fuses of the voltage pulse generator.

5. The system according to claim 1, wherein the 50%-50% switching distribution of the VCMA cells in the array of VCMA cells is independent of process, voltage, and temperature variations.

6. The system according to claim 1, wherein the magnitude and duration of the stochastically tuned voltage pulse falls within a range of magnitudes and durations that are dependent upon material properties of the VCMA cells in the array of VCMA cells.

7. A method for generating a true random number (TRN) or physically unclonable function (PUF), comprising:
generating a stochastically tuned voltage pulse with a voltage pulse generator;

applying the stochastically tuned voltage pulse to a plurality of voltage controlled magnetic anisotropy (VCMA) cells in an array of VCMA cells, wherein the stochastically tuned voltage pulse has a magnitude and duration that provides a 50%-50% switching distribution of the VCMA cells in the array of VCMA cells; and reading a state of each of the VCMA cells in the array of VCMA cells to provide the true random number (TRN) or physically unclonable function (PUF), wherein the voltage pulse generator includes a fuse-programmable circuit configured to generate the tuned voltage pulse, the fuse-programmable circuit including a plurality of capacitors and a plurality of fuses, each capacitor is coupled to ground through a respective fuse, and wherein the method further comprises adjusting the duration of the tuned voltage pulse by selectively blowing at least one of the fuses.

8. The method according to claim 7, wherein each VCMA cell in the array of VCMA cells comprises a magnetic tunnel junction (MTJ) device.

9. The method according to claim 7, wherein the array of VCMA cells comprise a spin transfer torque magnetic random access memory (STT-MRAM).

10. The method according to claim 7, wherein the 50%-50% switching distribution of the VCMA cells in the array of VCMA cells is independent of process, voltage, and temperature variations.

11. The method according to claim 10, wherein the magnitude and duration of the stochastically tuned voltage pulse falls within a range of magnitudes and durations that are dependent upon material properties of the VCMA cells in the array of VCMA cells.

12. A system for generating a true random number (TRN) or physically unclonable function (PUF), comprising:

a spin transfer torque magnetic random access memory (STT-MRAM), the STT-MRAM including an array of voltage controlled magnetic anisotropy (VCMA) cells;

a voltage pulse tuning circuit including a voltage pulse generator for generating and applying a stochastically tuned voltage pulse to the VCMA cells in the array of VCMA cells, wherein the stochastically tuned voltage pulse has a magnitude and duration that provides a 50%-50% switching distribution of the VCMA cells in the array of VCMA cells; and a bit output system for reading a state of each of the VCMA cells in the array of VCMA cells to provide the true random number (TRN) or physically unclonable function (PUF), wherein the voltage pulse generator includes a fuse-programmable circuit configured to generate the tuned voltage pulse, the fuse-programmable circuit including a plurality of capacitors and a plurality of fuses, wherein each capacitor is coupled to ground through a respective fuse, and wherein the duration of the tuned voltage pulse is adjusted by selectively blowing at least one of the fuses.

13. The system according to claim 12, wherein each VCMA cell in the array of VCMA cells comprises a magnetic tunnel junction (MTJ) device.

14. The system according to claim 12, further comprising a built-in test (BIST) system coupled to the voltage pulse generator, wherein the bit output system provides the TRN or PUF to the BIST, wherein the BIST system is configured to adjust the duration of the tuned voltage pulse by selectively blowing at least one of the fuses of the voltage pulse generator.

15. The system according to claim 12, wherein the 50%-50% switching distribution of the VCMA cells in the array of VCMA cells is independent of process, voltage, and temperature variations, and wherein the magnitude and duration of the stochastically tuned voltage pulse falls within a range of magnitudes and durations that are dependent upon material properties of the VCMA cells in the array of VCMA cells.

\* \* \* \* \*